(12) United States Patent
Fong et al.

(10) Patent No.: US 11,114,081 B2
(45) Date of Patent: Sep. 7, 2021

(54) DEVICE AGNOSTIC AUDIO PATH SEALING

(71) Applicant: PPIP LLC, Tempe, AZ (US)

(72) Inventors: Michael Fong, Chandler, AZ (US); Neric Hsin-wu Fong, Tempe, AZ (US); Teddy David Thomas, Bedford, NH (US); Haydn Bennett Taylor, Detroit, MI (US)

(73) Assignee: PPIP LLC, Chandler, AZ (US)

( * ) Notice: Subject to any disclaimer, the term of this patent is extended or adjusted under 35 U.S.C. 154(b) by 0 days.

(21) Appl. No.: 16/747,049

(22) Filed: Jan. 20, 2020

(65) Prior Publication Data

US 2020/0265825 A1 Aug. 20, 2020

Related U.S. Application Data

(60) Provisional application No. 62/806,583, filed on Feb. 15, 2019.

(51) Int. Cl.
| | |
|---|---|
| *H04R 29/00* | (2006.01) |
| *G10K 11/175* | (2006.01) |
| *H05K 9/00* | (2006.01) |
| *G06F 3/16* | (2006.01) |
| *H04B 1/3888* | (2015.01) |
| *G10L 25/51* | (2013.01) |

(52) U.S. Cl.
CPC ............ *G10K 11/175* (2013.01); *G06F 3/165* (2013.01); *G10L 25/51* (2013.01); *H04B 1/3888* (2013.01); *H04R 29/001* (2013.01); *H05K 9/0007* (2013.01)

(58) Field of Classification Search
CPC ..................................................... H04R 29/00
See application file for complete search history.

(56) References Cited

U.S. PATENT DOCUMENTS

| | | | |
|---|---|---|---|
| 10,831,236 B2* | 11/2020 | Tuttle ...................... | H05K 5/03 |
| 2014/0161273 A1* | 6/2014 | Soufan ..................... | H04K 3/43 |
| | | | 381/73.1 |
| 2016/0098983 A1* | 4/2016 | Lehmann ............. | G10K 11/175 |
| | | | 455/575.1 |
| 2016/0234356 A1* | 8/2016 | Thomas ............... | H05K 9/0069 |
| 2018/0277086 A1* | 9/2018 | Soffer ................. | G10K 11/175 |
| 2020/0090634 A1* | 3/2020 | Moran, Jr. ............. | H04R 1/028 |

* cited by examiner

*Primary Examiner* — Olisa Anwah
(74) *Attorney, Agent, or Firm* — Fernando & Partners, LLP

(57) ABSTRACT

In accordance with some embodiments, an apparatus that seals the audio path of an enclosed device is provided. The apparatus includes a first housing portion and a second housing portion, when mated, are arranged to enclose a device, where a surface of the second housing portion is arranged to impart pressure on the device toward the first housing portion. The apparatus further includes a first supporting portion disposed along one side of the first housing portion and arranged to support the device. The apparatus also includes a first liner disposed in the first housing portion and arranged to form a first cavity, where the first cavity is adjacent to the first supporting portion. The apparatus further includes a noise generator operable to provide noise signal stream and a first audio output device coupled to the noise generator operable to output first masking signals to the first cavity.

20 Claims, 7 Drawing Sheets

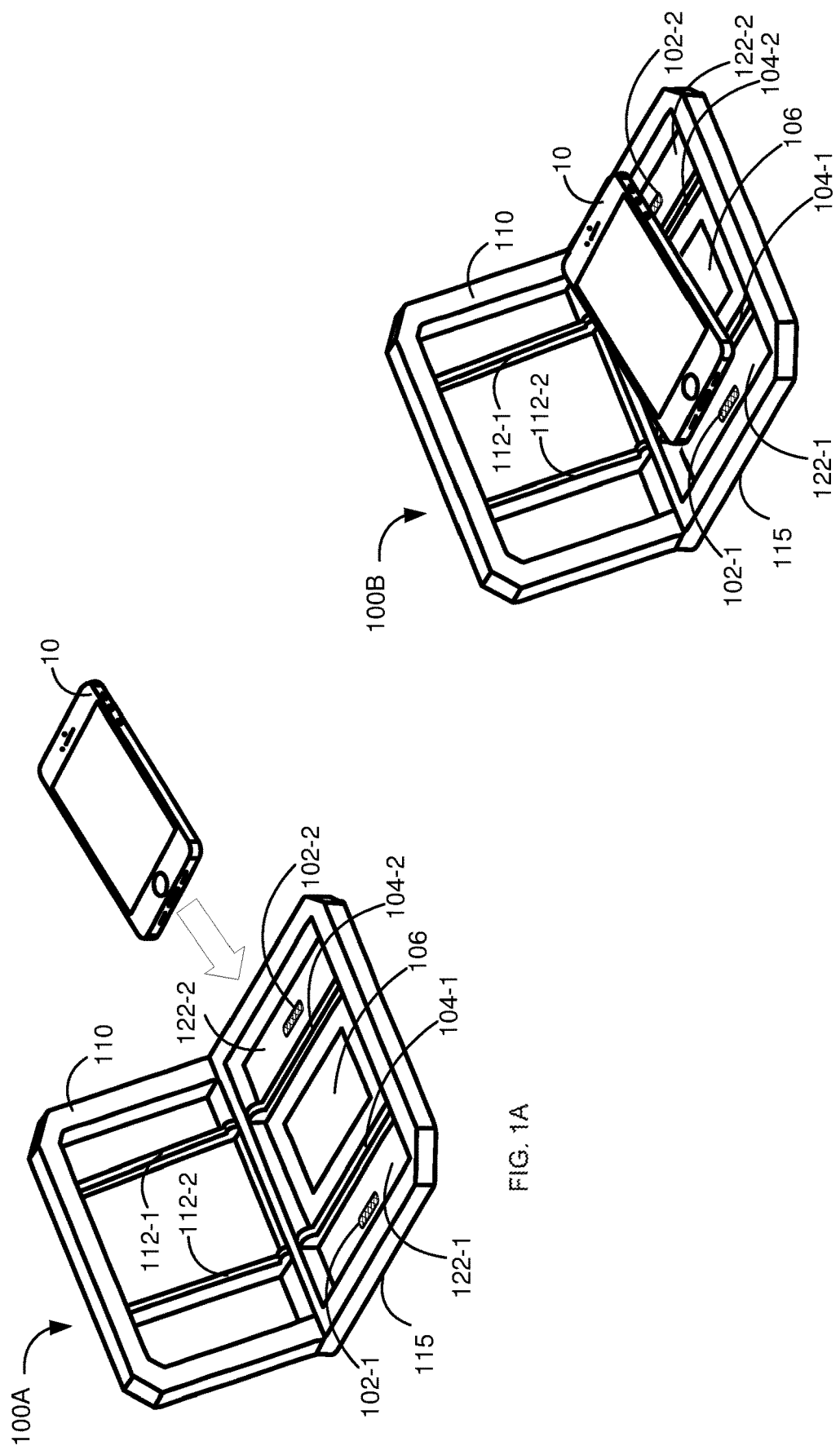

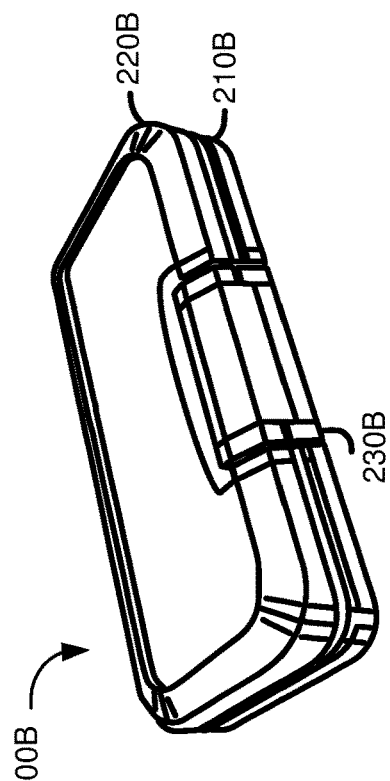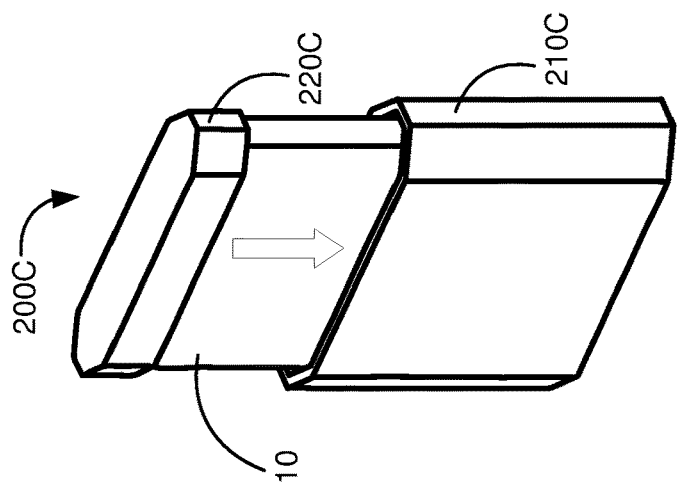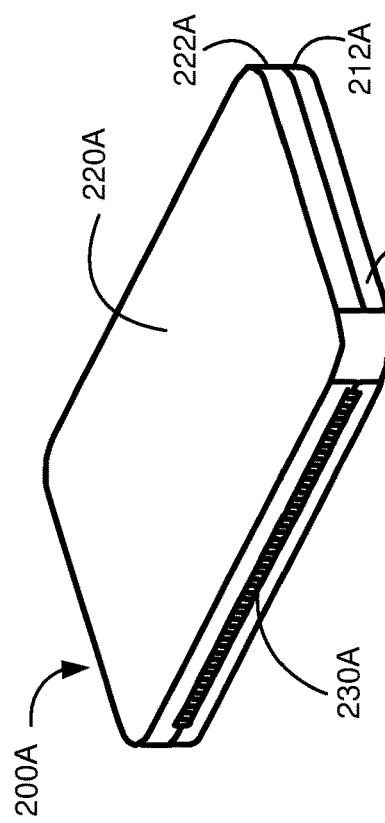

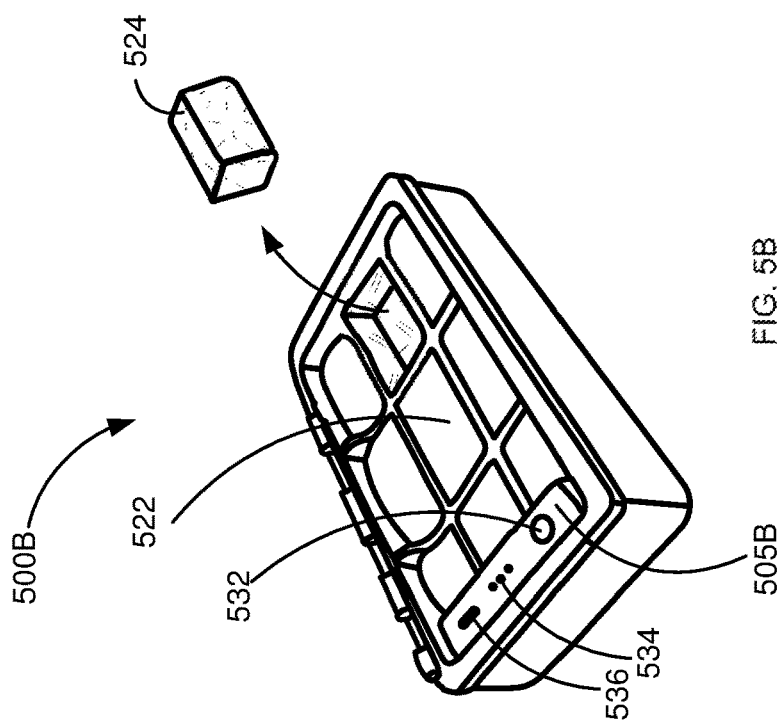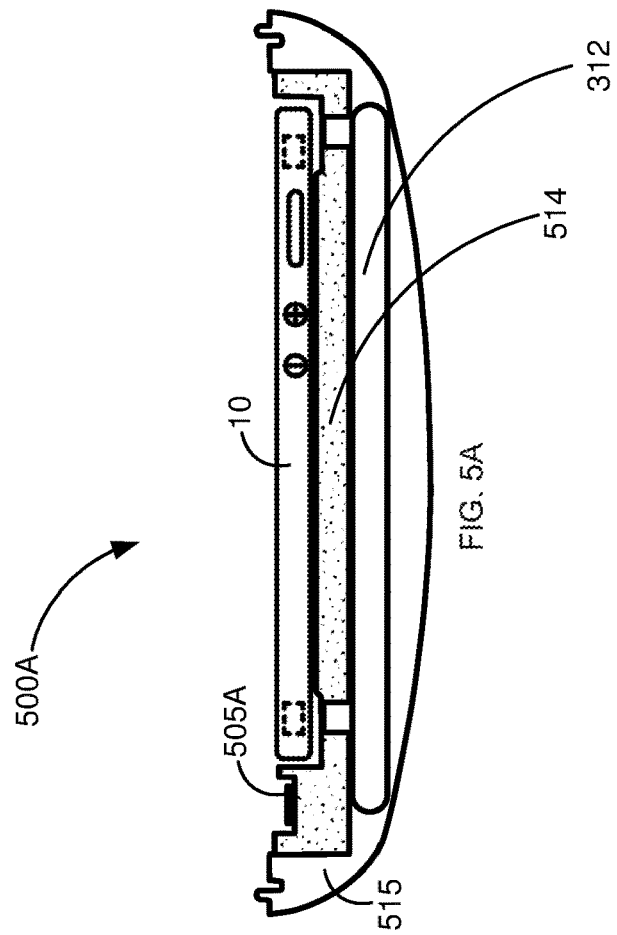

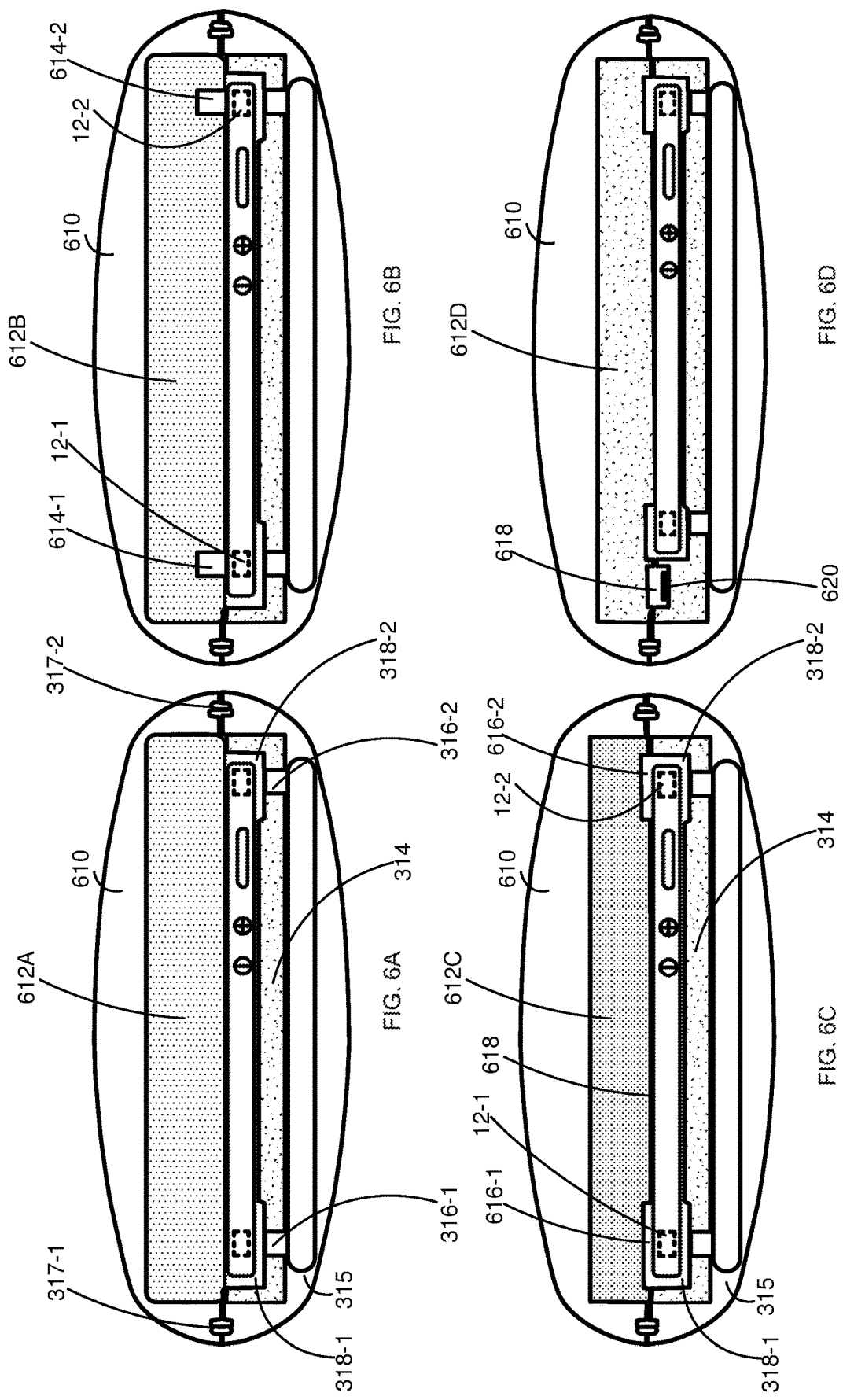

DEVICE AGNOSTIC AUDIO PATH SEALING

PRIORITY CLAIM

This application claims priority to U.S. provisional patent application No. 62/806,583 filed on Feb. 15, 2019, the contents of which are hereby incorporated by reference.

TECHNICAL FIELD

This relates generally to the field of privacy protection, and more specifically to an apparatus that seals the audio path of an enclosed device.

BACKGROUND

Mobile devices are susceptible to RF monitoring and tracking. Additionally, comprised smart devices can allow bad actors to steal "Data in Vicinity" by listening through microphones and/or watching through cameras. Previously existing privacy protection mechanisms include a Faraday bag. However, previously existing Faraday bag cannot provide adequate protection. Typically, a Faraday bag is a bag with materials that reduce electromagnetic signals. Special sewing techniques, such as dual paired seam construction, are used to hold devices (e.g., cell phones) while attempting to prevent outside signals from interfering with the device inside the bag. With growing RF frequency spectrum in use and stronger RF signal transmissions, these Faraday bags provide weaker protection, e.g., typically less than −70 dB of protection across multiple different frequencies. Studies have shown that a commercially available smartphone inside conventional Faraday bags can still send and receive data. As such, previously existing Faraday bags provide a false sense of security. More importantly, conventional Faraday bags provide no audio protection for the devices placed inside. Accordingly, a Faraday bag is acoustically transparent, thus creating opportunities for the bad actors to eavesdrop.

BRIEF DESCRIPTION OF THE DRAWINGS

So that the present disclosure can be understood by those of ordinary skill in the art, a more detailed description can be had by reference to aspects of some illustrative embodiments, some of which are shown in the accompanying drawings.

FIGS. 1A and 1B are perspective views of a privacy/security protection apparatus in accordance with some embodiments;

FIGS. 2A-2C are various embodiments of a privacy/security protection apparatus in accordance with some embodiments;

FIG. 5A is a cross-sectional view of at least a portion of a privacy/security protection apparatus supporting a personal communication device in accordance with some embodiments;

FIG. 5B is a perspective view of at least a portion of a privacy/security protection apparatus in accordance with some embodiments;

FIGS. 6A-6D are cross-sectional views of various embodiments of a privacy/security protection apparatus in accordance with some embodiments.

Figure 3:
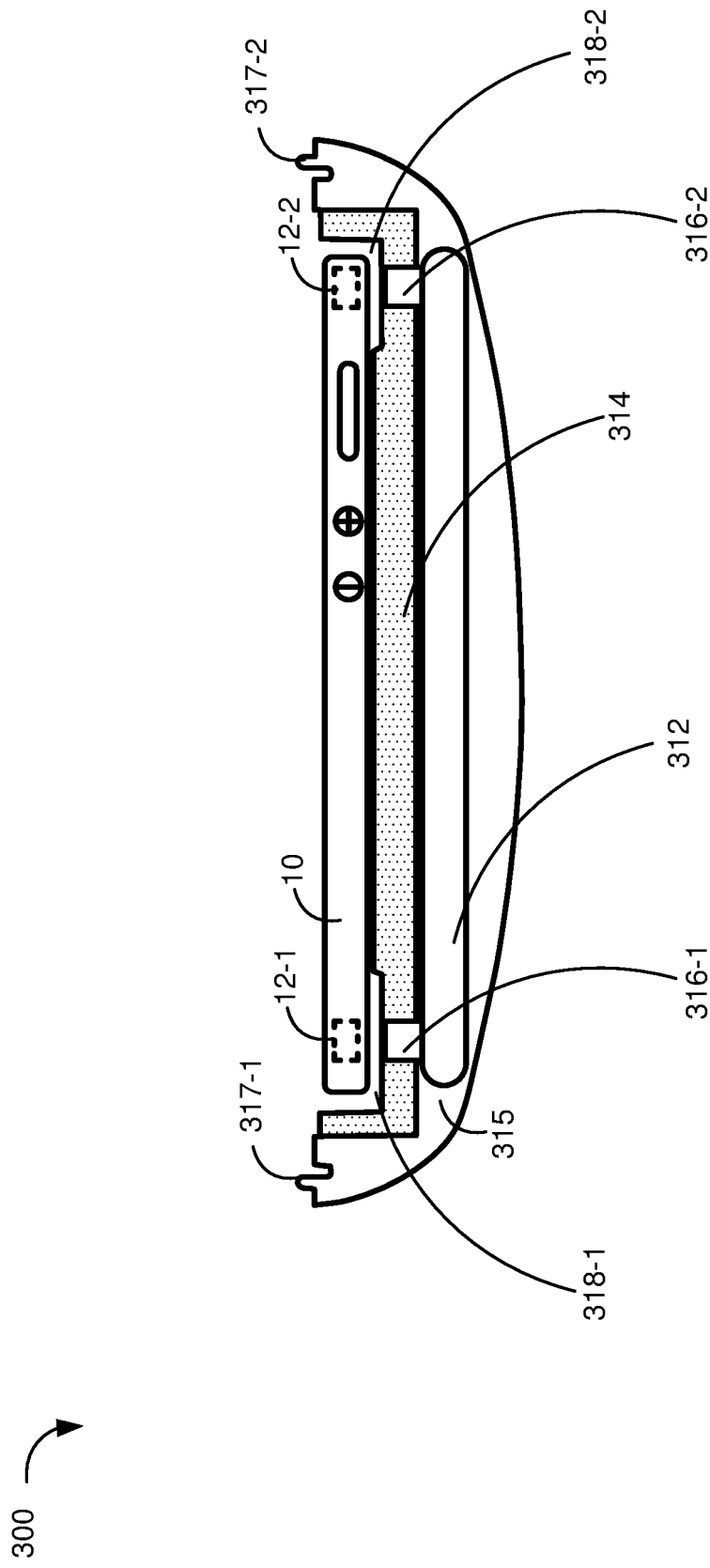
FIG. 3 is a cross-sectional view of at least a portion of a privacy/security protection apparatus in accordance with some embodiments.

In accordance with common practice the various features illustrated in the drawings cannot be drawn to scale. Accordingly, the dimensions of the various features can be arbitrarily expanded or reduced for clarity. In addition, some of the drawings cannot depict all of the components of a given system, method or device. Finally, like reference numerals can be used to denote like features throughout the specification and figures.

DETAILED DESCRIPTION

Accordingly, described herein is an apparatus that seals the audio path of an enclosed device and provides enhanced RF shielding. In some embodiments, the apparatus includes physical structures that provide passive acoustical attenuation. In accordance with some embodiments, a clamshell removeable Faraday cage apparatus provides full RF and audio masking for a personal communication device placed inside, thus protecting the device from RF hacking and/or location tracking. In particular, the Faraday cage in accordance with embodiments described herein can block RF signals across a wide spectrum of frequency bands (e.g., 100 dB+), including but not limited to Wi-Fi, cellular, GPS, Bluetooth, RFID signals. The reduction of RF signals thus keeps the personal communication device inside the Faraday case against RF attacks (cellular, Wi-Fi, Bluetooth, etc.). Further, the Faraday cage can also actively jam audio signals, e.g., through noise masking signals and/or voice morphing. As such, relative to previously existing Faraday bags, the audio and RF protective apparatus presented herein provides a broader range of protection and thus is more effective in user privacy protection.

In some embodiments, the apparatus includes mateable portions, such as a first housing portion (e.g., a bottom shell) and a second housing portion (e.g., a lid or a cover). When the first housing portion and the second housing portion are matingly engaged (e.g., closing the lid or moving the cover to cover the bottom), an enclosure is formed. The enclosure can receive and hold a personal communication device. The physical barrier formed by the first housing portion and the second housing portion blocks, absorbs and/or attenuates sound waves as well as radio frequency (RF) waves, thus provides passive acoustical attenuation as well as RF shielding to the enclosed device. In addition, the apparatus provides active acoustical attenuation as well as enhanced RF protection.

For instance, the active acoustical attenuation is provided by including a noise generator and one or more output devices. The noise generator generates one or more noise signal streams; and the one or more output devices output a masking signal as a function of the one or more noise signal streams. In some embodiments, the noise signal is directed at the personal communication device inside the enclosure, so that the noise signal masks sound (e.g., the ambient sound from outside the enclosure) recorded by the personal device. As such, the apparatus seals the audio path to the one or more personal communication devices in the enclosure and protects a user of the personal communication device against unwanted privacy invasion.

In accordance with some embodiments, the apparatus comprises a first housing portion (e.g., a base portion) and a second housing portion (e.g., a lid portion). When the first housing portion and the second housing portion are mated, they are arranged to enclose a personal communication device (e.g., a mobile device) and a surface of the second housing portion is arranged to impart pressure on the personal communication device toward the first housing portion. The apparatus also includes a first supporting portion that is disposed along one side of the first housing portion and arranged to support the personal communication device. The apparatus further includes a first liner disposed in the first housing portion and arranged to form a first cavity, where the first cavity is adjacent to the first supporting portion. The apparatus additionally includes a noise generator that is operable to provide noise signal stream. Further, the apparatus includes a first audio output device (e.g., a speaker that is coupled to the noise generator and at least partially supported by the first housing portion, where the first audio output device is operable to output first masking signals to the first cavity and the first masking signals are generated based at least in part on the noise signal stream.

In accordance with some embodiments, a device includes one or more processors, non-transitory memory, and one or more programs; the one or more programs are stored in the non-transitory memory and configured to be executed by the one or more processors, and the one or more programs include instructions for performing or causing performance of the operations of any of the methods described herein. In accordance with some embodiments, a non-transitory computer readable storage medium has stored therein instructions which, when executed by one or more processors of a device, cause the device to perform or cause performance of the operations of any of the methods described herein. In accordance with some embodiments, a device includes means for performing or causing performance of the operations of any of the methods described herein.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact, unless the context clearly indicates otherwise.

The terminology used in the description of the various described embodiments herein is for the purpose of describing particular embodiments only and is not intended to be limiting. As used in the description of the various described embodiments and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when", "upon", "in response to determining", or "in response to detecting", depending on the context. Similarly, the phrase "if it is determined" or "if [a stated condition or event] is detected" is, optionally, construed to mean "upon determining", "in response to determining", "upon detecting [the stated condition or event]," or "in response to detecting [the stated condition or event]," depending on the context.

It should be appreciated that in the development of any actual embodiments (as in any development project), numerous decisions must be made to achieve the developers' specific goals (e.g., compliance with system and business-related constraints), and that these goals will vary from one embodiment to another. It will also be appreciated that such development efforts might be complex and time consuming, but would nevertheless be a routine undertaking for those of ordinary skill in the art of image capture having the benefit of this disclosure.

Referring to FIG. 1A, FIG. 1A is a perspective view of an apparatus 100A for privacy and/or security protection of a personal communication devices 10, in accordance with some embodiments. In some embodiments, the personal communication device 10 (also known as a user equipment) protected by the apparatus 100A can be a mobile or stationary communication device, including, but not limited to, a cellular phone, a smart phone, a wearable device (e.g., a smartwatch), a computer (e.g., a tablet or a laptop), a portable or stationary gaming device, a portable or stationary video or audio device, etc. In some embodiments, the personal communication device 10 has communication capabilities and is able to collect information of the surroundings. For example, the personal communication device 10 can include an radio frequency (RF) transceiver, an audio input device, an audio output device, a video input device, a video output device, a near-field communication (NFC) device, a Bluetooth (BL)/Bluetooth low energy (BLE) radio, a WiFi modem, and/or a radio-frequency identification (RFID) device, an accelerometer, a gyroscope, a magnetometer (e.g., as part of an inertial measurement unit (IMU)), a light sensor, and/or acoustic sensors, etc. The information (e.g., audio/video information), once collected by the personal communication device 10, can be transmitted to a remote source using communication interfaces of the personal communication device 10.

For example, the remote communication interface can use any of a plurality of communications standards, protocols, and technologies, including but not limited to Global System for Mobile Communications (GSM), Enhanced Data GSM Environment (EDGE), high-speed downlink packet access (HSDPA), high-speed uplink packet access (HSUPA), Evolution, Data-Only (EV-DO), HSPA, HSPA+, Dual-Cell HSPA (DC-HSPDA), long term evolution (LTE), wideband code division multiple access (W-CDMA), code division multiple access (CDMA), time division multiple access (TDMA), and/or Wi-Fi (e.g., IEEE 802.11a, IEEE 802.11b, IEEE 802.11g, IEEE 802.11n, and/or IEEE 802.11ac), or any other suitable communication protocol, including communication protocols not yet developed as of the filing date of this document.

In order to protect the personal communication device 10, in some embodiments, the apparatus 100A includes a housing assembly, which further includes a first housing portion 115 (e.g., a base portion) and a second housing portion 110 (e.g., a lid or a cover). The housing assembly can be at least partially moved, adjusted, opened, or closed to adjust a level of the privacy and/or security protection. In some embodiments, the first housing portion 115 and/or the second housing portion 110 are made of rigid, semi-rigid, and/or structurally self-supporting materials. When the apparatus 100A is open, as shown in FIG. 1A, an inner region (also known as an enclosure when the housing assembly is closed) can receive and hold the personal communication device 10.

In some embodiments, when the first housing portion 115 matingly engages the second housing portion 110, the housing assembly can at least partially block sensing and/or communication capabilities of the enclosed personal communication device 10. In other words, the apparatus 100A can at least partially block the monitoring and surveillance of the enclosed personal communication device 10 from outside the housing assembly. For example, the first and second housing portions 115 and 110 can form a clamshell type enclosure, such that the top shell is connected with the lower shell and the enclosure is formed by closing together the top shell and bottom shell around a pivot point or a hinge. As such, when the apparatus 100A is closed, the top shell and the bottom shell sandwich the personal communication device 10 in the middle. In such configuration, the top shell 110 and the bottom shell 115 can be matingly coupled and/or engaged. Accordingly, when the lid 110 is closed, the housing assembly of the apparatus 100A can prevent, reduce, or limit the microphone's ability to capture audio content (e.g., the lid 110 and the base 115 include sound shielding materials to block sound), the camera's ability to record images (e.g., the lid 110 and the base 115 include non-transparent materials to block light), and/or the RF transceivers' ability to transmit or receive RF signals (e.g., the lid 110 and the base 115 include RF shielding materials to form a Faraday cage). In other words, when the lid 110 is closed, the closed clamshell shaped housing assembly 105 can prevent, reduce, or limit the sound, light, and/or RF signals outside the enclosure, and protect the enclosed personal communication device 10.

Though not shown in FIG. 1A, in some embodiments, one or more grooves within a portion of the apparatus 100 provide at least partial sealing of the enclosure. For example, a dual groove structure or a single groove (e.g., as shown in FIG. 3) can be implemented to form an environmental barrier that substantially attenuates or at least partially blocks the propagation of acoustic signal. In some embodiments, one groove can extend at least partially around an edge of the second housing portion 110, and another groove can extend at least partially around an edge of the first housing portion 115. The groove extending around the edge of the second housing portion 110 and the groove extending around the edge of the first housing portion 115 are arranged to matingly engage when the apparatus 100A is closed. As such, the physical barrier formed by the sealing structure, including the grooves 125 and 135, provides further passive acoustical, light, and RF signal shielding and/or attenuation.

In some embodiments, the apparatus 100A includes at least one supporting portion, e.g., the ridge 104-1. In some embodiments, the at least one supporting portion is malleable, deformable, and/or semi-flexible. In some other embodiments, the at least one supporting portion is rigid and/or configurable or movable. The supporting portion is disposed along one side (e.g., the phone side, the inner side, or the upside) of the first housing portion 115 and arranged to support the personal communication device 10 when the personal communication device 10 is placed inside the inner region of the apparatus 100A. In some embodiments, the apparatus 100A includes more than one supporting portion for support and grip of the personal communication device 10, e.g., the ridge 104-2 and/or the middle portion 106 rising above the surrounding surface. In some embodiments, the multiple supporting portions are parts of one liner made of deformable or semi-flexible material (e.g., elastomer or foam) that includes trough(s) and/or depression as well as ridges and rising portions to accommodate, cradle, and/or grip at least a portion of the personal communication device 10.

Likewise, as will be described in further detail below, one or more supporting portions 112 are disposed along one side (e.g., the phone side, the inner side, or the downside) of the second housing portion 110. In some embodiments, the one or more supporting portions are malleable, deformable, and/or semi-flexible. In some other embodiments, the one or more supporting portions are rigid and/or configurable or movable. In some embodiments, as will be described in further detail below, the one or more supporting portions 112 are parts of one liner (e.g., a liner 314 shown in FIG. 3) made of deformable or semi-flexible material (e.g., elastomer or foam) that includes trough(s) and/or depression as well as ridges and rising portions. The liner is arranged to impart pressure on the personal communication device 10 toward the first housing portion 115 when the first housing portion 115 and the second housing portion 110 are mated. As such, the lid 110 is closed, the supporting portions 104, 106, and 112 substantially hold the personal communication device 10 in place.

In some embodiments, the apparatus 100A further includes at least one liner disposed in the first housing portion 115 and arranged to form at least one cavity 122. For instance, the first cavity 122-1 is formed by a liner adjacent the supporting portion 104-1, and the second cavity 122-2 is formed by a liner that is adjacent the supporting portion 104-2. In some embodiments, a surface of at least one liner 122 comprises sound reflective and/or diffusing materials, e.g., rubber, elastomer, pre-compressed wood, etc. In some embodiments, each of the at least one liner 122 includes at least one opening 102 (or a hole, a slit, or a cutout) to facilitate sound passing from an audio output device to the at least one cavity 122. As such, when using acoustic reflective and/or diffusing materials, the surface of the at least one liner 122 reflects sound waves in the cavity 122. In some embodiments, the at least one liner forming the at least one cavity 122 and the at least one supporting portion 104 and/or 106 are all part of one liner.

FIG. 1B is a perspective view of an apparatus 100B for privacy and/or security protection of a personal communication devices 10, in accordance with some embodiments. In FIG. 1B, the personal communication device 10 is substantially placed inside the inner region of the apparatus 100B. Once placed inside, the personal communication device 10 is supported by the supporting portion(s) 104 and/or 106. Further, once placed inside, one end (e.g., the bottom or footer portion) of the personal communication device 10 is positioned proximate the first cavity 122-1, while another end (e.g., the top or header portion) of the personal communication device 10 is positioned proximate the second cavity 122-2. As such, when the lid 110 is closed, the first cavity 122-1 encloses an opening of an audio input device (e.g., a microphone, not shown) on the personal communication device 10, and the second cavity 122-2 encloses an opening of another audio input device (e.g., another microphone, not shown) on the personal communication device 10. Additionally, as will be described in further detail below, the supporting portions 104 disposed in the base portion 115 along with the supporting portions 112 disposed in the lid portion 110 form seals around the cavities 122 to maximize the effect of noise masking.

It should be noted that FIGS. 1A and 1B illustrate one embodiment of the housing assembly. Other shapes and forms of the housing assembly that provide acoustical, light, and/or RF protection can be used to receive and hold the personal communication device 10 in accordance with various embodiments. FIGS. 2A-2C illustrates other shapes and forms of the housing assembly. Further, it should be noted that inside the housing assembly, the shapes and forms of the liners can be used and/or configured to provide acoustical, light, and/or RF protection of the personal communication device 10. For example, the shape and size of the cavities 122 may various and re-configurable. In some embodiments, more than one opening 102 is included in the liner 122 for better coverage of the personal communication device 10 with multiple microphones.

FIG. 2A illustrates a perspective view of a privacy/security protection apparatus 200A according to some embodiments that includes round corners. In some embodiments, the privacy/security protection apparatus 200A can comprise a housing that includes a base portion 210A and a lid portion 220A coupled by a hinge 230A. As shown, in some embodiments, the corners of the base portion 210A and the lid portion 220A are round so that the corners are curved. In some embodiments, the edge interfaces of the corners of the base portion 210A and the lid portion 220A can be substantially flat as they meet with the top surfaces of the portions 212A and 222A. Further, the transition from the top surface of the base portion 210A and to the wall surface of the base portion 210A, and the transition from the top surface to the wall surface of the lid portion 220A can include a sharp or abrupt edge. Moreover, in some embodiments, the edge can be at least partially curved.

In another example, FIG. 2B illustrates a perspective view of a privacy/security protection apparatus 200B according to some embodiments. The privacy/security protection apparatus 200B can comprise a housing assembly that further includes a base portion 210B, a lid portion 220B, and a latch 230B to secure the closing the base portion 210B and the lid portion 220B. In some embodiments as shown, the corners of the base portion 210B and the lid portion 220B can include a reduction in the radius of curvature of the corners. In some embodiments, the reduced radius in the corners can reduce distortion and wear of the surfaces of the privacy/security protection apparatus 200B.

In yet another example, FIG. 2C illustrates a perspective view of a privacy/security protection apparatus 200C enclosing the personal communication device 10 in accordance with some embodiments. In some embodiments, the privacy/security protection apparatus 200C can comprise a structure that accommodates the personal communication device 10 as a sleeve. In some embodiments, the structure includes a base portion 210C and a lid portion 220C. The personal communication device 10 can be inserted into the base portion 210C from the top and the lid portion 220C can be pushed towards the base portion, as indicated by the arrow, to close the apparatus 200C. When closed, the mated base portion 210C and lid portion 220C form a Faraday cage to protect the enclosed personal communication device 10. Further, when closed, the mated base portion 210C and lid portion 220C form physical barriers to acoustic and light waves.

It should be noted that though FIGS. 1A-1B and 2A-2B illustrate at least semi-rigid housing, in some embodiments, at least some portions of the structurally self-supporting apparatus 100A, 100B, 200A, 200B, and/or 200C can comprise a flexible and/or compliant material. For example, the material can include at least one of cloth or fabric, a polymer or polymer composite film or sheet, or other flexible material. In such embodiments, the enclosure inside the apparatus can be structurally supported by the enclosed personal communication device 10. For example, the apparatus 100A, 100B, 200A, 200B, and/or 200C can be a flexible bag, which can be laid flat or folded when empty, but can be configured to expand to fit the personal communication device 10 inside. When the apparatus 100A, 100B, 200A, 200B, and/or 200C is made of flexible and/or complaint material, different from conventional Faraday bags, as will be described in detail below, the apparatus 100A, 100B, 200A, 200B, and/or 200C can provide active acoustic and/or RF protection.

FIG. 3 illustrates a cross-sectional view of at least a portion of an apparatus 300 supporting the personal communication device 10, in accordance with some embodiments. As explained above with reference to FIGS. 1A-1B and 2A-2C, in some embodiments, the apparatus 300 for privacy and security protection includes a housing assembly, which further comprises a first housing portion 315 (e.g., a base portion) and a second housing portion (e.g., a lid portion, not shown). In addition to the physical barrier formed by the housing assembly for privacy and/or security protection, in some embodiments as will be described in further detail below, components including but not limited to a power supply, a noise generator, a controller, a circuitry, and one or more audio output devices, are positioned in a portion 312 to provide active sound masking and/or RF shielding. In some embodiments, the portion 312 is disposed in the first housing portion 315 and is at least partially supported by the first housing portion 315.

In some embodiments, at least one liner 314 covers the portion 312. As such, one side of the portion 312 is held by the first housing portion 315 and the other side of the portion 312 is held by the adjacent at least one liner 314. As explained above, in some embodiments, the liner 314 provides one or more supporting portions to support and hold the personal communication device 10 in place. Additionally, as will be describe in further detail below, in some embodiments, the liner 314 includes sound attenuation or acoustic shielding and/or absorbing material that can reduce the amount of masking from leaking out of the apparatus 300, thereby reducing the obtrusiveness of the masking signal to the outside environment.

In FIG. 3, the middle rising portion of the liner 314 is a supporting portion that support and grip the personal communication 10. Also as explained above, a portion of the liner 314 can also form a cavity. For example, a first cavity 318-1 close to one end of the personal communication device 10 is formed by one portion of the liner 314, while a second cavity 318-2 close to the other end of the personal communication device 10 is formed by a different portion of the liner 314. When the personal communication device 10 is placed on the liner 314, the rising ridge of the liner 314 supports the personal communication device 10 and a gap is formed between two ends of the personal communication device 10 and the troughs of the liner 314. In some embodiments, the gap is within a threshold distance, e.g., the surface in the troughs portion is approximately 2 mm or no more than 2 mm away from the bottom of the personal communication device.

In some embodiments, a surface of the portion of the liner 314 that forms the cavities 318 comprises sound reflective and/or diffusing materials, e.g., rubber, elastomer, pre-compressed wood, etc. Further, in some embodiments, the liner 314 includes at least one opening 316 (or a lot, a window, a hole, a slit, or a cutout) to facilitate sound passing from an audio output device in the portion 312 to a respective cavity 318. As such, when using acoustic reflective and/or diffusing materials, the surface of the at least one liner 122 reflects sound waves in the cavities 318. The bounding sound waves allow more efficient sound masking and save energy.

The first opening 316-1 is positioned proximate to a microphone 12-1 of the personal communication device 10, and the second opening 316-2 is positioned proximate to another microphone 12-2 of the personal communication device 10. As such, when the speakers (not shown) in the portion 312 output the masking signals that are directed to the personal communication device 10, the masking signals are directed and fed to the microphones 12 in close distance.

In some embodiments, the first housing portion 315 also includes a tongue or a groove ring 317. In some embodiments, a matching groove positioned on a second housing portion (e.g., a lid portion) is arranged to matingly engage when the apparatus 300 enclosure is closed. In some embodiments, each tongue or groove 317 includes a conductive gasket that can add incremental RF shielding based at least in part on the number of tongues, grooves, and conductive gaskets.

Figure 4:
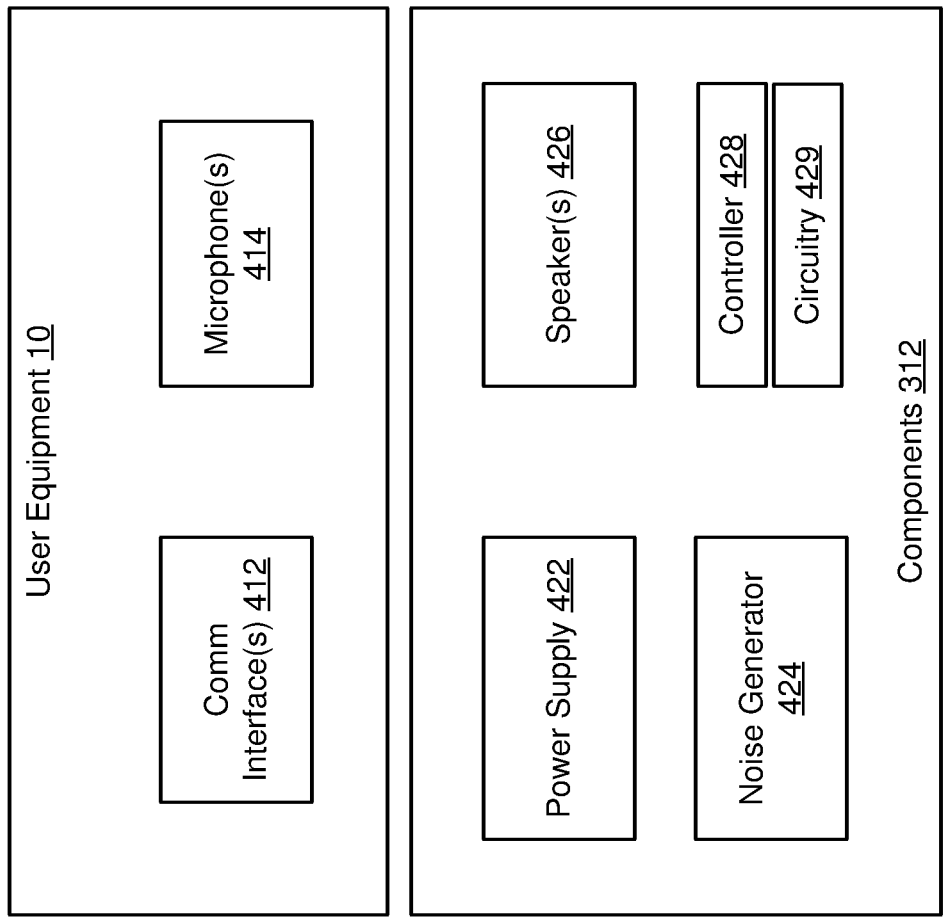
FIG. 4 is a block diagram of components in a portion of a privacy/security protection apparatus in accordance with some embodiments.

FIG. 4 is a block diagram 400 of components in the portion 312 inside a privacy/security protection apparatus in accordance with some embodiments. As explained above with reference to FIG. 1A, the user equipment 10 includes one or more communication interfaces 412 and microphones 414 that can potentially be comprised and exploited. In some embodiments, the privacy/security protection apparatus 405 disclosed herein includes a power supply 422, a noise generator 424, one or more speakers 426, a controller 428, and a circuitry 429.

The noise generator 424 is operable to provide noise signal stream. The at least one speaker 426 is coupled to the noise generator 424 and operable to output masking signals to at least one cavity (e.g., the cavity 122 in FIG. 1 and/or the cavity 318 in FIG. 3. In some embodiments, the masking signals are generated based at least in part on the noise signal stream. In some other embodiments, the masking signals modifies ambient sound (e.g., recorded with a microphone on the case 405) and/or add noise such as wind noise, traffic sound, music, or other voice for shaping or morphing the masking signals, so that the sound recorded by the microphone(s) 414 is masked and not identifiable or intelligible for privacy protection.

In some embodiments, the noise signal 424 from the noise generator 104 is associated with a random (or pseudorandom) number sequence. In some embodiments, the noise signal is generated within a digital signal processor (DSP), field programmable gate array (FPGA), application-specific integrated circuit (ASIC), microprocessor, and/or by the firmware/software (e.g., through the use of pseudo random number generators and/or algorithms such as AES encryption with various key lengths etc.). In other embodiments, the noise signal is generated by external or dedicated electronic components, such as a diode or a resistor that generates electronic noise. In some embodiments, the noise signal is generated by applying power (e.g., provided by the power supply 422) to the resistor and/or by the diode in breakdown mode and measuring and/or sampling the noise created. In some embodiments, the noise signal can be used as a random seed to generate multiple uncorrelated audio signal streams, e.g., by re-using the same seed or sampling such seed at pre-determined or randomized intervals to produce uncorrelated noise signal streams for masking two or more audio input devices. As used herein, a random seed is a number (or vector) used to initialize a random or pseudorandom number generator. In some embodiments, as shown in FIGS. 1A-1B and 3, the case 405 includes multiple speakers 426. In such embodiments, the speakers 426 can receive uncorrelated noise signal streams and output different audio content (e.g., pass-through, noise, modified, processed, manipulated or otherwise changed content) for different microphones 414. As such, the audio content played is uncorrelated, and thus it is more difficult to derive the protected audio content (e.g., through elaborated efforts), such as by comparing the audio signals from different microphones 414.

In some embodiments, the controller 428 is coupled to the noise generator 422 and includes a validation engine to adjust an amplitude of the output sound and a spectral shaper to control the noise signal stream from the noise generator. For instance, the controller can obtain a spectral envelope with target spectral characteristics (e.g., pink noise, white noise, ballpark sound, etc.) and applying the spectral envelope in order to modify the spectral characteristics of the noise signal from the noise generator.

In some embodiments, in addition to coupling the noise from the noise generator 424 to the speaker(s) 426, the controller 428 selectively couples the noise signal from the noise generator 424 and/or re-recorded audio content to the speaker(s) 426. For example, the controller 428 couples audio tracks that sound like an airport, a pre-recorded conversion, etc. As such, the spoofing audio content is outputted by the speaker(s) 426 and recorded by the microphone(s) 414 of the user equipment 10.

In some embodiments, the power supply 422 supplies power to one or more of the controller 428, the noise generator 424, the speaker(s) 426, and/or the circuitry 429. In some embodiments, the power supply 422 includes at least one of a battery, a charging socket, a USB connector, a power plug, and/or a power socket. In some embodiments, the power supply 422 can further supply power to the user equipment 10.

In some embodiments, the circuitry 429 powered by the power supply 422 enables the privacy/security protection apparatus as a highly functional Faraday cage and facilitate the generation of interfering RF signals. For example, the circuitry 429 can include a ferrite bead and a filter to form a DC pass-through assembly. In some embodiments, capacitors of the circuitry 429 include a short circuit to high frequencies (e.g., frequencies above about 1 MHz), and the inductors (e.g., the ferrite beads) are high impedance to those high frequencies. Consequently, in some embodiments, the high frequencies have a low impedance path to the privacy/security protection apparatus and high impedance to pass through. Moreover, the chambered design as shown can protect the wires from picking up RF radiation, while the direct current flow has a low impedance through (e.g., when powering the user equipment 10) and a high impedance to the privacy/security protection apparatus. In some embodiments, at least a portion of the RF signals generated by the circuitry 429 confuses the use equipment 10, e.g., to trick the user equipment 10 into thinking that the user equipment 10 is not located near a GPS spoofer.

In some embodiments, one or more of the components 312 is turned off or on by the opening or closing of the apparatus. For example, when the lid is open, one or more of components 312 is automatically turned off, so that active RF and/or acoustical shielding described above can be turned off automatically along with the ending of the passive protection by the case. On the other hand, when the lid is closed, active RF and/or acoustical shielding described above can be turned on automatically along with the start of the passive protection by the case.

FIG. 5A illustrates a cross-sectional view of at least a portion of an apparatus 500A supporting the personal communication device 10, in accordance with some embodiments. The apparatus 500A is similar to and adapted from the apparatus 100A-B, 200A-B, and 300 shown in FIGS. 1A-1B, 2A-2C, and 3. Elements common to these figures include common reference numbers, and the differences are described herein for the sake of brevity. To that end, a liner 514 is disposed in a first housing portion 515 of the apparatus 500A. In some embodiments, the liner 514 provides one or more supporting portions to support and hold the personal communication device 10 in place, e.g., the middle rising portion of the liner 515. Further, a portion of the liner 514 also at least partially supports a control panel 505A. The control panel 505A is connected to components in the portion 312 (e.g., the components as shown in FIG. 4).

FIG. 5B illustrates a perspective view of at least a portion of a privacy/security protection apparatus 500B in accordance with some embodiments. The apparatus 500B is similar to and adapted from the apparatus 100A-B, 200A-B, 300, and 500A shown in FIGS. 1A-1B, 2A-2C, 3, and 5. Elements common to these figures include common reference numbers, and the differences are described herein for the sake of brevity. To that end, the privacy/security protection apparatus 500B includes modular and/or reconfigurable liner(s), such as removable foam blocks 522 or removeable rigid blocks. For instance, while the different personal communication devices from different manufactures vary in size and dimension, the liner is configurable such that at least one foam block 524 can be moved or removed. As such, the liner can hold a personal communication device (not shown) placed on top of the liner and at the same time maximize the effect of active sound masking described above, e.g., with cavities positioned close to audio input device(s) on the personal communication device and ridges of the supporting portions seal the surroundings of the cavities. Thus, the privacy/security protection apparatus disclosed herein accordance with various embodiments is device agnostic and effectively seals the audio path to the enclosed personal communication device.

FIG. 5B also shows a control panel 505B panel at least partially supported by the lining and/or the housing of the privacy/security protection apparatus 500B. In some embodiments, controls on the control panel 505B include, but not limited to an input device (e.g., a button) 532 coupled to the controller in the portion 312 (FIG. 5A) for controlling the sound masking and/or RF shielding, LED indicator(s) 534 coupled to the power supply 422 (FIG. 4) and/or the controller for indicating status of the sound masking and/or RF shielding, and/or a USB connector 536 that is connectable to the personal communication device 10 (not shown). In some embodiments, the button 532 allows the user to select the level of sound masking and/or RF shielding. Upon receiving the user input, the controller can direct the speaker to adjust the level of output masking signals.

Though FIGS. 5A and 5B show the control panel 505 inside the privacy/security protection apparatus 500, the control panel 505 components of the control panel can locate inside or outside the apparatus 500. For example, the LED indicator(s) 534 can provide an indication of acoustic and/or RF protection level through the Faraday cage so that users can be alerted if their privacy protection is running out (e.g., due to low power level from the power supply 422, FIG. 4). By having tiny holes to reveal the LED indicator(s) 534 to the outside environment, the protection status is provided without reducing attenuation (e.g., RF attenuation) materially.

FIGS. 6A-6D illustrate cross-sectional views of various embodiments of a privacy/security protection apparatus supporting the personal communication device 10, in accordance with some embodiments. The base portion of the privacy/security protection apparatus as shown in FIG. 3 is used an example to illustrate various embodiments of the top portion of the privacy/security protection apparatus. Other embodiments of the base portion can be used in place of or to vary the embodiment shown in FIG. 3.

In FIG. 6A, the privacy/security protection apparatus includes a second housing portion 610 (e.g., a lid) mateable with the first housing portion 315 (e.g., the base). When mated, the first housing portion 315 and the second housing portion 610 are arranged to enclose the personal communication device 10. Further, a surface of the lid 610 is arranged to impart pressure on the personal communication device 10 toward the base 315 in accordance with some embodiments. In some embodiments, a second supporting portion 612A (e.g., a liner) is disposed in the lid 610, where a surface of the liner 612 provides or becomes the inner surface (or the phone side of the surface) of the lid 610 and the liner 612 is arranged to impart pressure on the personal communication device 10 toward the base 315. In some embodiments, the liner 612A presses again the personal communication device 10 to hold the it in place and to squeeze out the air, which is a media for acoustic energy transmission. In some embodiments, the liner 612A comprises sound and/or RF shielding materials to protect the enclosed personal communication device 10.

In FIG. 6B, a second supporting portion 612B (e.g., a liner) with one or more openings 614 (or slots or windows) positioned proximate to one or more openings of microphone(s) on the personal communication device 10. The openings allow masking sound passing and the masking sound is directed to the microphones 12 on the personal communication. In some embodiments, the openings 614 are connected to one or more speakers of the privacy/security protection apparatus (e.g., the speaker(s) 426 shown in FIG. 4).

In FIG. 6C, a second supporting portion 612C (e.g., a liner) with a ridge 618 in the middle and one or more cavities 616 adjacent to the ridge 618. The one or more cavities 616 are positioned proximate to one or more openings of microphone(s) 12 on the personal communication device 10. When the lid 610 and the base 315 are mated, the cavity 616-1 on the top and the cavity 318-1 at the bottom form one chamber enclosing the opening of the microphone 12-1, and the cavity 616-2 on the top and the cavity 318-2 at the bottom form one chamber enclosing the opening of the microphone 12-1. The ridge 618 imparts pressure on the personal communication device 10 toward the base 315 in order to hold the personal communication device 10 in place and seals the cavities 616. Even though the cavity 616 is positioned on one side (e.g., front side) of the personal communication device 10 and the cavity 318 is positioned on a different side (e.g., back side) of the personal communication device 10, the chamber allows the masking sound propagate to both the front side and the back side of the personal communication device 10. As such, in case the personal communication device 10 includes one microphone on the front and another microphone on the back, the masking sound can jam both microphones.

It should be noted that the liner 612 as shown in FIGS. 6A-6D is re-configurable and/or moveable. For instance, in addition to cavities 616 that proximately match the locations of cavities 318 as shown in FIG. 6C, in some embodiments, the liner 612 further includes a separate cavity 618 to accommodate a control panel 620. Further in some embodiments, the liner 612 can be malleable or rigid.

Figure 7:
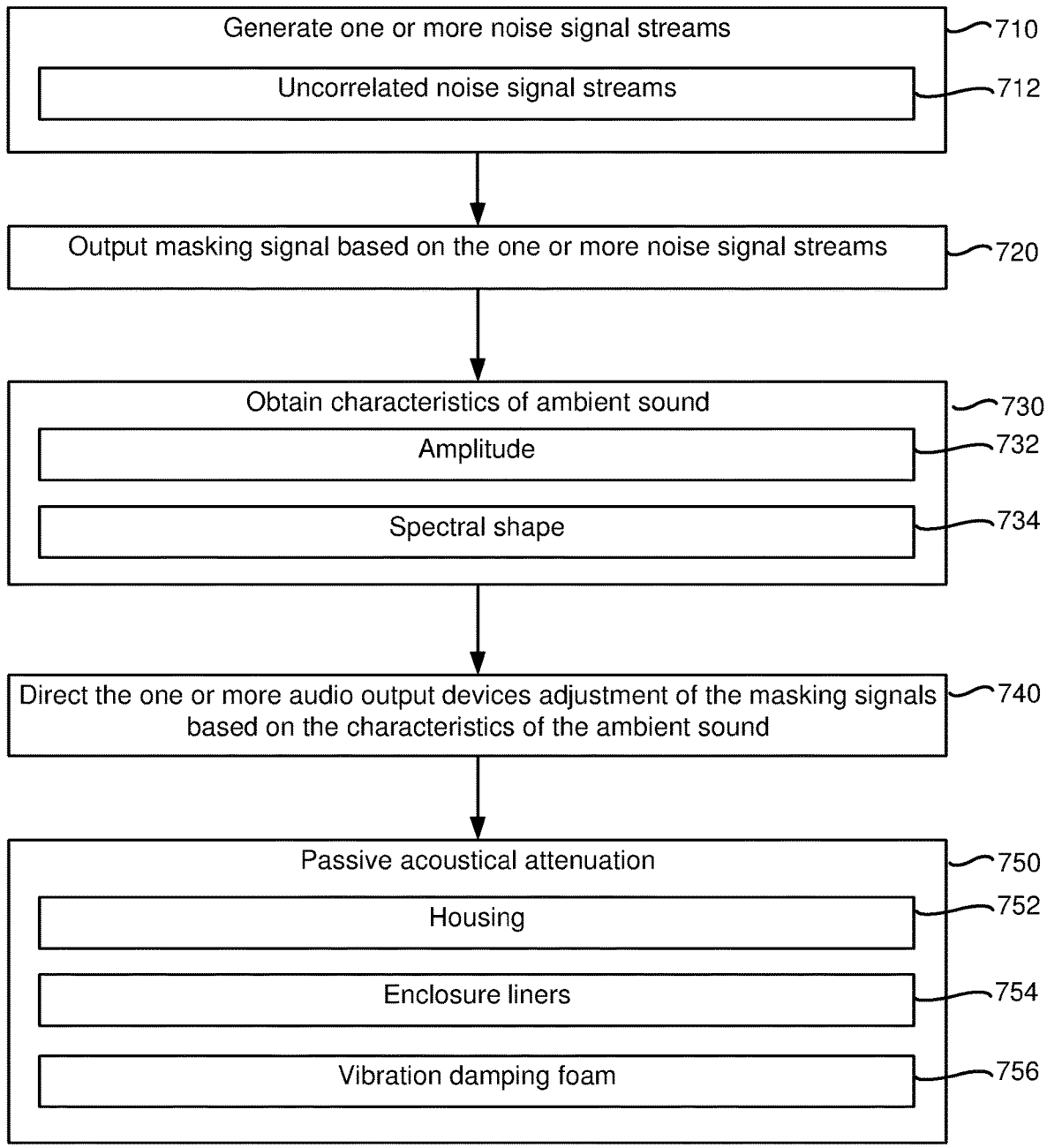
FIG. 7 is a flowchart illustrating a method of audio path sealing in accordance with some embodiments.

FIG. 7 is a flowchart representation of a method 700 for audio path sealing, in accordance with some embodiments. In some embodiments, the method 700 is performed at a privacy/security protection apparatus (e.g., the apparatus shown in FIGS. 1A-1B, 2A-2C, 3, 5A-5B, and 6A-6D) with a controller (e.g., the controller 428), a non-transitory memory storing instructions for execution by the controller, a noise generator (e.g., the noise generator 424), one or more audio output devices (e.g., the speaker(s) 426 in FIG. 4). Briefly, the method 700 includes steps of active acoustical attenuation in order to protect an enclosed personal communication device. The active acoustical attenuation, combined with passive acoustical attenuation provided by the physical structure of the apparatus, seals the audio path to the enclosed personal communication device. The audio path sealing thus prevents potential privacy invasion of the users of the enclosure personal communication device.

To that end, as represented by block 710, the method 700 includes generating, by the noise generator (e.g., the noise generator 424), one or more noise signal streams. In some embodiments, the one or more noise signal streams are true or pseudo randomized noise signal streams. In some embodiments, the noise signal streams are generated based on audio signals captured by one or more audio input devices of the apparatus, e.g., by distorting and/or obfuscating the ambient sound, or prerecorded random audio signal. In some embodiments, as represented by block 712, the noise signal streams are uncorrelated. For example, one masking signal from the noise generator (e.g., the noise generator 424) can be used as a random seed to generate multiple uncorrelated noise signal streams, e.g., by reusing the same seed or sampling such seed at pre-determined or randomized intervals to produce uncorrelated masking signal streams in order to mask two or more audio input devices of the enclosed personal communication devices.

In some embodiments, the uncorrelated masking signal streams are generated by first generating a key generated by a key generator. The key is then fed to the true or pseudo random number generator to generate a random number sequence. Through sampling, windowing, or other number sequence dividing mechanisms, the random number sequence is divided into subsets and each random number sequence is provided to a true or pseudo random number generator as a seed to produce the plurality of uncorrelated masking signal streams.

In some embodiments, the random number sequence generated by a true or pseudo random number generator can be a long sequence. In such embodiments, instead of using a portion of the random number sequence as a seed to generate more random numbers, the key generator divides the random number sequence produced by the true or pseudo random number generator into smaller portions, and the randomizing chains use the smaller portions to produce discrete random number sequences.

In some embodiments, as represented by block 720, the method 700 includes outputting, by the one or more audio output devices (e.g., the speaker(s) 426 in FIG. 4), noise signal based on the one or more noise signal streams, where the noise signal is directed at one or more personal communication devices inside the enclosure of the apparatus. For example, as shown in FIGS. 6A-6D, once the apparatus is closed, the speakers direct the noise signal at the enclosed personal communication device 10. As such, the noise signal actively masks, blocks, attenuates, distorts, confuses, reduces, and/or eliminates the ability of the audio input devices of the enclosed personal communication device 10.

In some embodiments, as represented by block 730, the method 700 includes obtaining, through one or more audio input devices of the privacy/security protection apparatus, characteristics of ambient sound outside the enclosure of the apparatus. For example, microphone(s) can be placed outside the apparatus, installed on the exterior surface of the apparatus, or embedded in the housing of the apparatus, so that the microphone(s) can record the ambient sound from the surroundings. In some embodiments, a validation engine and/or an envelope detector are coupled to the audio input device(s), so that the amplitude, as represented by block 732, and/or spectral shape, as represented by block 734 are obtained as characteristics of the ambient sound.

In some embodiments, as represented by block 740, the method 700 includes directing the one or more audio output devices, by the controller, adjustment of the noise signal based on the characteristics of the ambient sound. For example, a validation engine as part of the controller is coupled to the envelope detector and the spectral shaper to form a feedback loop. The envelope detector measures the ambient sound recorded by the audio input device(s), and the validation engine obtains the measurement from the envelope detector in order to derive the frequency response and/or the amplitude of the ambient sound. The frequency response is then provided to the spectral shaper and causes the spectral shaper to adjust the shaped audio signal as a function of the frequency response, and the validation engine directs the audio output device(s) (e.g., the speaker(s) 426) to adjust the output audible noise level based on a determination that the output noise level is not appropriate (e.g., too high or too low) for masking ambient sound.

Still referring to FIG. 7, in addition to the active acoustical attenuation described above as represented by blocks 710-740, in some embodiments, the method 700 includes passive acoustical attenuation, as represented by block 750. For example, as represented by block 752, the enclosure can be formed by a first housing portion and a second housing portion, when mated, the first housing portion and the second housing portion at least partially block the personal communication device from receiving audio signal from outside the enclosure. In such embodiments, the housing can also at least partially block the masking signal from escaping to the outside environment. In another example, as represented by block 754, the first housing portion and the second housing portion provide a seal (e.g., a single or dual groove structure with flexible material covering the groove as shown in FIGS. 3 and 6A-6D) to attenuate sound. In yet another example, as represented by block 756, the enclosure is surround by an enclosure liner, and the enclosure liner includes the at least one sound attenuation layer, e.g., the liners 314 and 618 as shown in FIGS. 6A-6D.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best use the invention and various described embodiments with various modifications as are suited to the particular use contemplated.

What is claimed is:

1. An apparatus comprising:
a first housing portion and a second housing portion, when mated, are arranged to enclose a personal communication device, and a surface of the second housing portion is arranged to impart pressure on the personal communication device toward the first housing portion;
a first supporting portion disposed along one side of the first housing portion and arranged to support the personal communication device;
a first liner disposed in the first housing portion and arranged to form a first cavity, wherein the first cavity is adjacent to the first supporting portion;
a noise generator operable to provide noise signal stream; and
a first audio output device coupled to the noise generator, at least partially supported by the first housing portion, operable to output first masking signals to the first cavity, wherein the first masking signals are generated based at least in part on the noise signal stream, the first liner includes at least one opening allowing passing of sound from the first audio output device to the first cavity, and the at least one opening is positioned proximate to an input device on the personal communication device.

2. The apparatus of claim 1, wherein a surface of the first liner includes sound reflective material.

3. The apparatus of claim 1, wherein one or more of the first supporting portion and the first liner include reconfigurable modules.

4. The apparatus of claim 1, further comprising a second supporting portion disposed in the second housing portion, wherein the second supporting portion provides the surface of the second housing portion arranged to impart pressure on the personal communication device toward the first housing portion.

5. The apparatus of claim 1, further comprising a second liner disposed in the second housing portion arranged to form a second cavity, wherein when the first housing portion and the second housing portion are mated, the first cavity is positioned on a first side of the personal communication device and the second cavity is positioned on a second side of the personal communication.

6. The apparatus of claim 5, wherein when the first housing portion and the second housing portion are mated, the first cavity and the second cavity form one chamber enclosing openings of one or more input devices on the personal communication device.

7. The apparatus of claim 1, further comprising:
a controller, coupled to the noise generator, operable to control the noise signal stream and a magnitude of the output masking signals; and
a power supply, coupled to one or more of the controller, the noise generator, and the first audio output device.

8. The apparatus of claim 7, further comprising:
a circuitry coupled to the controller and the power supply, operable to generate RF signals.

9. The apparatus of claim 8, wherein the RF signals generation is turned on when the first housing portion and the second housing portion are mated and turned off when the first housing portion and the second housing portion are not mated.

10. The apparatus of claim 7, further comprising:
an input receiving device, coupled to the controller and operable to receive a user input, wherein the controller received the user input directs the first audio output device to adjust the magnitude of the output masking signals in response to the user input.

11. The apparatus of claim 7, further comprising:
an envelope detector, coupled to the controller, operable to detect a level of ambient sound, wherein the controller directs the first audio output device to adjust the magnitude of the output masking signals in accordance with the level of ambient sound.

12. The apparatus of claim 7, wherein the controller selectively couples the noise signal stream and audio tracks to the first audio output device.

13. The apparatus of claim 1, further comprising:
a second liner disposed in the first housing arranged to form a second cavity, wherein:
the second cavity is adjacent to a second supporting portion,
the first cavity is proximate a first input device on the personal communication device, and
the second cavity is proximate a second input device on the personal communication device.

14. The apparatus of claim 13, further comprising a second audio output device coupled to the noise generator, at least partially supported by the first housing portion, operable to output second masking signals to the second cavity, wherein:
the second masking signals are generated based at least in part on the noise signal stream, and
the first masking signals and the second masking signals are uncorrelated.

15. The apparatus of claim 1, wherein the first housing portion and the second housing portion include one or more of RF shielding material, light shielding material, and sound attenuation material.

16. The apparatus of claim 1, further comprising a second supporting portion disposed along the one side of the first housing portion and arranged to support the personal communication device along with the first supporting portion.

17. The apparatus of claim 1, wherein the first supporting portion is malleable.

18. The apparatus of claim 1, wherein the first supporting portion is rigid.

19. The apparatus of claim 1, further comprising an indicator indicating a level of the first masking signals.

20. The apparatus of claim 1, wherein the first housing portion and the second housing portion provide a seal, including a groove structure with flexible material covering the groove structure.

* * * * *